United States Patent [19]

Chapman et al.

[11] 4,377,904
[45] * Mar. 29, 1983

[54] METHOD OF FABRICATING A NARROW BAND-GAP SEMICONDUCTOR CCD IMAGING DEVICE

[75] Inventors: Richard A. Chapman, Dallas; Dennis D. Buss, Richardson; Michael A. Kinch, Dallas, all of Tex.

[73] Assignee: Texas Instruments Incorporated, Dallas, Tex.

[*] Notice: The portion of the term of this patent subsequent to Nov. 4, 1997, has been disclaimed.

[21] Appl. No.: 185,468

[22] Filed: Sep. 9, 1980

Related U.S. Application Data

[62] Division of Ser. No. 950,191, Oct. 10, 1978, Pat. No. 4,231,149.

[51] Int. Cl.³ ............... H01L 21/20; H01L 21/285; H01L 27/14
[52] U.S. Cl. ................................ 29/578; 29/571; 29/572; 29/590; 29/591; 148/1.5; 148/174; 148/175; 148/191; 156/653; 156/657; 156/659.1; 427/87; 427/93; 357/24; 357/61; 357/91
[58] Field of Search ............ 427/87, 93; 357/24, 357/61, 91; 148/174, 175, 191; 29/572, 578, 571, 590, 591, 1.5; 156/652, 653, , 657, 659.1

[56] References Cited

U.S. PATENT DOCUMENTS

| | | | |
|---|---|---|---|
| 3,931,674 | 1/1976 | Amelio | 29/578 |
| 3,977,018 | 8/1976 | Catagnus et al. | 204/56 R |
| 4,035,665 | 7/1977 | Borel | 357/24 |
| 4,097,885 | 6/1978 | Walsh | 357/24 |
| 4,273,596 | 6/1981 | Gutierrez et al. | 29/571 X |

OTHER PUBLICATIONS

Anderson, "Tunnel Current—Infrared Charge Coupled Devices" Infrared Physics, vol. 17, No. 2, Mar. 1977, pp. 147–164.
Chapman et al, "HgCdTe Charge-Coupled Device Shift Registers", Applied Phys. Letters, vol. 32 (7), Apr. 1, 1978, pp. 434–436.

Primary Examiner—L. Dewayne Rutledge
Assistant Examiner—W. G. Saba
Attorney, Agent, or Firm—Gary C. Honeycutt; Melvin Sharp; James T. Comfort

[57] ABSTRACT

A monolithic charge-coupled infrared imaging device (CCIRID) is fabricated on N-type HgCdTe. A native oxide layer on the semiconductor is used, in combination with ZnS to provide first level insulation. An opaque field plate over first level insulation is provided for signal channel definition. Second level insulation (ZnS) is substantially thicker than the first level, and is provided with a stepped or sloped geometry under the first level gates. Input and output diodes are provided with MIS guard rings to increase breakdown voltages.

5 Claims, 8 Drawing Figures

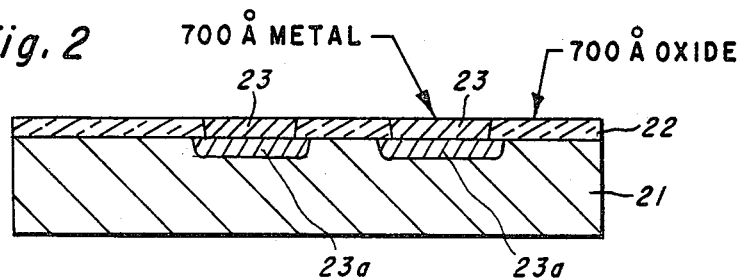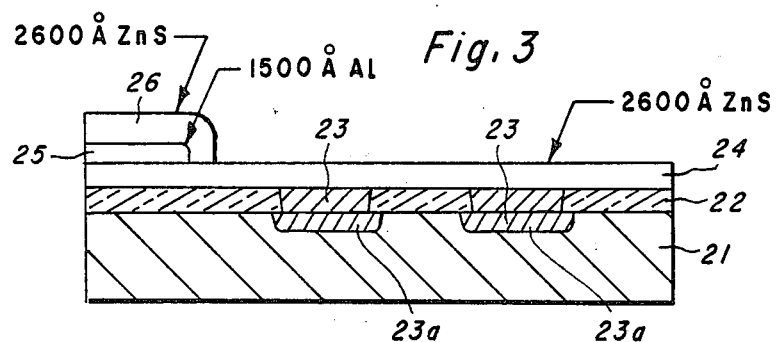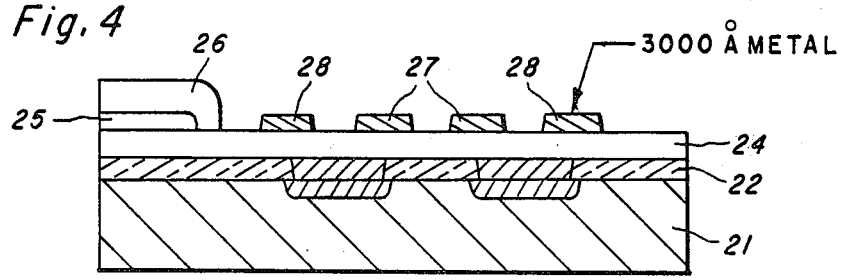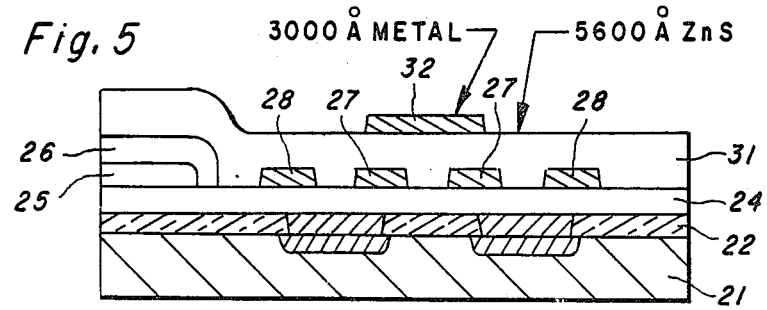

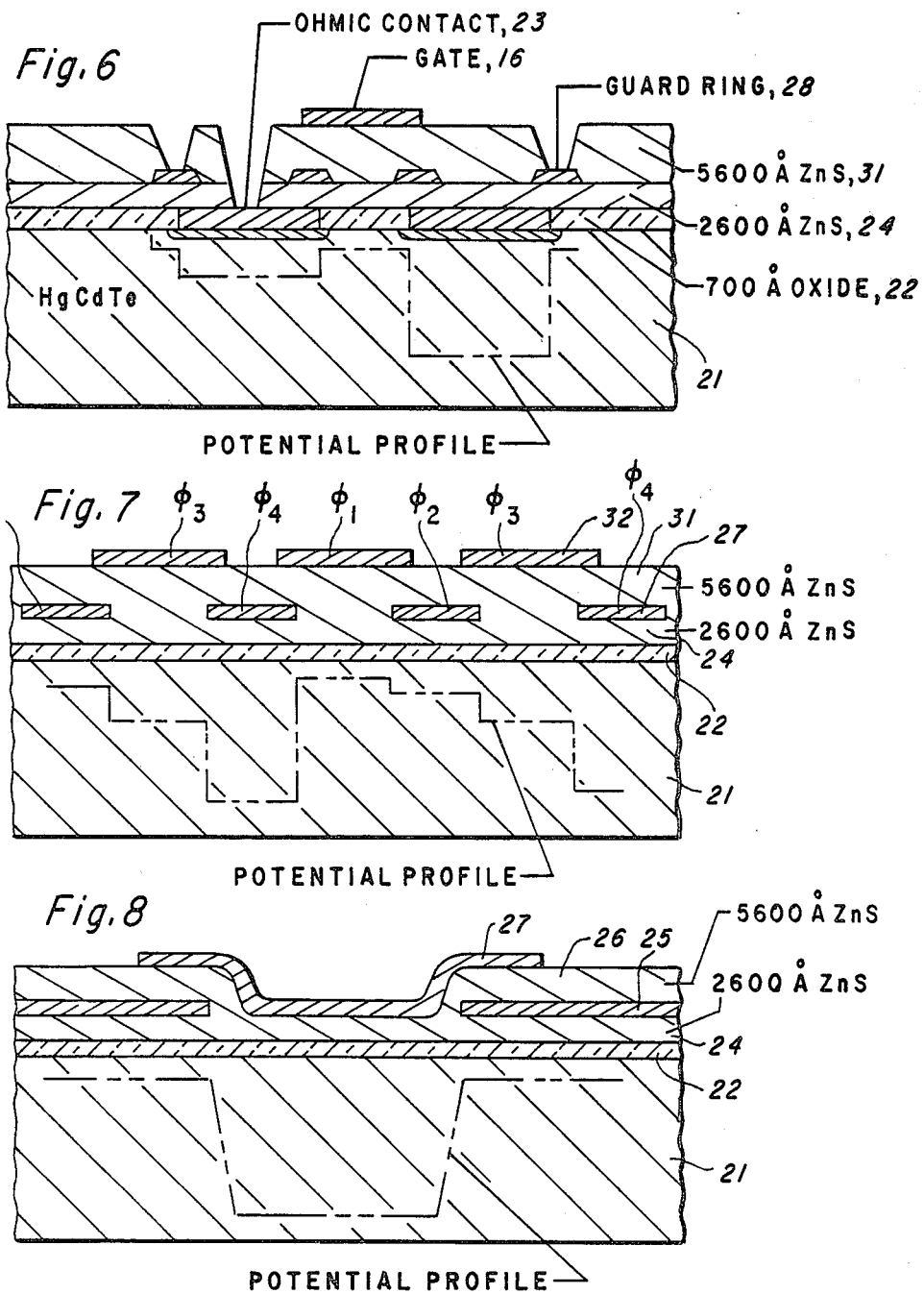

METHOD OF FABRICATING A NARROW BAND-GAP SEMICONDUCTOR CCD IMAGING DEVICE

This is a division of application Ser. No. 950,191, filed Oct. 10, 1978, now U.S. Pat. No. 4,231,149.

This invention relates to charge-coupled infrared imaging devices (CCIRID's) and more particularly relates to a monolithic CCIRID fabricated on mercury cadmium telluride. The device and method feature native oxide insulation on the semiconductor, in combination with zinc sulfide to provide additional insulation; an opaque field plate over first level insulation for signal channel definition; graded or stepped insulation geometry under the first level gates; and MIS guard rings surrounding input and output diodes to increase breakdown voltages.

Basically, infrared imaging with the charge-coupled device concept has been implemented in three different ways. That is, a silicon CCD has been used to multiplex an array of infrared detectors; a silicon CCD has been used to provide time delay and integration for an array of infrared detectors; and finally, a monolithic charge-coupled infrared imaging device has been fabricated in an infrared sensitive semiconductor.

The monolithic approach fabricated on indium antimonide was reported by Phillips et al of the Santa Barbara Research Center (citation). The first published report of a mercury cadmium telluride charge-coupled device appears in Applied Physics Letters Vol. 32, No. 7, Apr. 1, 1978, page 434.

A monolithic imaging device fabricated in the appropriate narrow band gap semiconductor represents perhaps the best approach to infrared imaging. The absorption coefficient of the intrinsic material is high, which permits high quantum efficiencies to be realized. Moreover, the high absorption coefficient eliminates cross-talk effects that can occur in silicon structures. Higher permissible operating temperatures are also an advantage which can be critically important in many applications where cooling is impractical.

However, the fabrication of charge transfer devices in narrow band gap semiconductor materials has been slow to develop. The primary reason for this difficulty lies, of course, in the nature of the materials themselves. That is, tunneling and avalanche breakdown occur at extremely low voltages, compared with silicon. For example, in mercury cadmium telluride ($Hg_{0.7}Cd_{0.3}Te$) the band gap is about 0.25 electron volt at 77° C. Consequently, the techniques for building MOS devices in silicon cannot be transferred intact to narrow band gap materials. It has also been noted that due to the high-background photon flux in the infrared storage cells saturate quickly and that the combination of high-background photon flux and low contrast imposes severe limits on the tolerable amount of non-uniformity from cell to cell. Severe constraints are thus imposed upon material homogeneity and photolithographic tolerances.

Accordingly, it is an object of the present invention to provide an infrared imaging device having a high quantum efficiency and relatively higher operating temperatures, without the complexity of multiple interconnections and cross-talk effects that are characteristic of hybrid arrays. More particularly, it is an object of the invention to provide a monolithic charge-coupled infrared imaging device on narrow band gap materials of the ternary alloy type, such as mercury cadmium telluride and lead tin telluride.

One aspect of the invention is embodied in a process for the fabrication of an infrared CCD imager beginning with the step of oxidizing the surface of a monocrystalline mercury cadmium telluride body to form a native oxide layer thereon, preferably 500 to 1000 angstroms thick. Since mercury cadmium telluride is a physically soft material, the processing is carried out initially using substrates mounted on sapphire supports with a synthetic resin adhesive, such as epoxy resin, for example. Native oxide growth on HgCdTe results in stable surfaces with a low surface density.

The next step involves a selective removal of predetermined portions of the native oxide layer to form appropriate windows therein at locations selected for the fabrication of input and output diodes. Oxide removal is achieved using a KTFR photoresist pattern and a chemical etch. The diodes may be formed by conventional diffusion or ion implantation or Schottky barrier diodes may be formed by depositing a suitable conductor in the windows to form rectifying contacts with the semiconductor surface.

Next, a layer of zinc sulfide is deposited to cover the diodes and the native oxide layer. This constitutes the first layer of gate insulation. The zinc sulfide is deposited, for example, by thermal evaporation at 800° C. to form a layer having a thickness of 2,000–3,000 angstroms or preferably about 2,600 angstroms thick. Next, a channel stop conductor is deposited and patterned on the zinc sulfide layer for the purpose of defining the charge transfer signal channel. A layer of evaporated aluminum is suitable, for example, deposited to a thickness of 1,000 to 2,000 angstroms and preferably about 1,500 angstroms thick.

Next, a second layer of zinc sulfide insulation is deposited and patterned to overlap the channel stop metal pattern.

A first plurality of metal gates is then deposited and patterned on the second zinc sulfide layer. Concurrently therewtih, guard rings are deposited and patterned to surround the input and output diode locations, thereby increasing the breakdown voltage.

A third layer of zinc sulfide is then deposited to cover the first level gates, followed by the step of depositing and patterning a second plurality of metal gates on the third zinc sulfide layer, overlapping the intervals between the first level metal gates.

Contact vias are then etched through the zinc sulfide, to the separate metal layers, and to the substrate, followed by the deposition and patterning of bonding pads, preferably nickelindium.

All pattern delineation is preferably carried out using a KTFR lift process, but eching processes can be employed. This involves forming a photoresist pattern prior to deposition of the metal or insulator in question. The film is then deposited and the patterning achieved by removing the photoresist, which selectively carries with it the material deposited thereon. As recognized by one skilled in the art, this "inverse" photoresist technique requires a higher standard of care than conventional photoresist techniques. Because the resist is removed after film deposition, thicker photoresist patterns than normal must be used to facilitate the removal step.

FIGS. 2–5 are cross-sectional views of a mercury cadmium telluride wafer showing a process sequence for fabrication of an embodiment of the invention.

FIG. 6 is a cross-sectional view of the input structure of a CCD channel of the invention.

FIG. 7 is a cross-sectional view taken longitudinally of a single CCD channel of the imaging array of the invention.

FIG. 8 is a cross-sectional view taken transversely of the CCD channel of FIG. 7.

Figure 1:
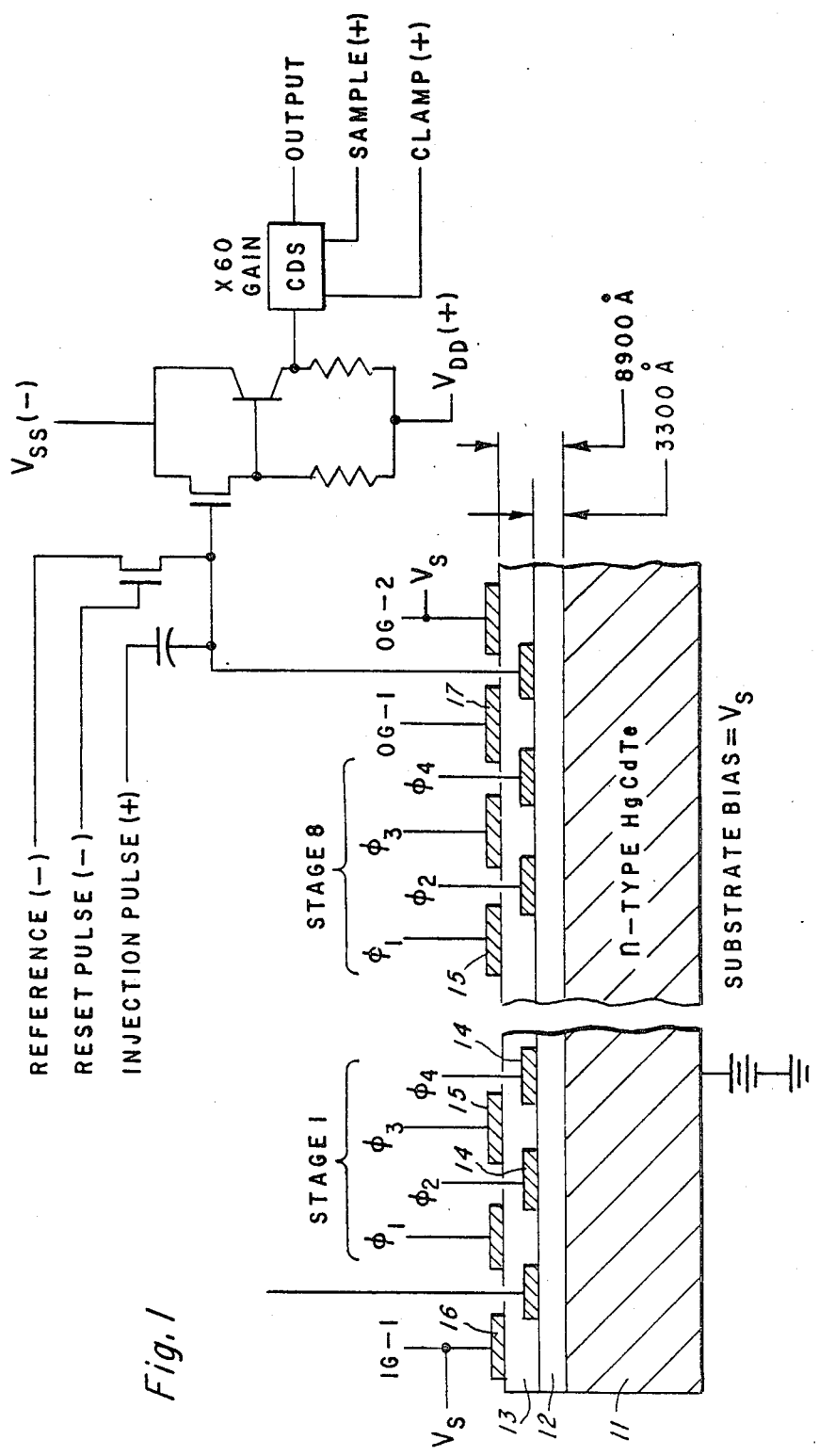
FIG. 1 is a schematic cross-section of one channel of an infrared CCD imager of the invention.

In FIG. 1, the imaging device of the invention is seen to consist of an n-type mercury cadmium telluride substrate 11 having first-level insulation layer 12 and second-level insulation layer 13 thereon, in combination with first-level gates 14 sandwiched between the insulation layers, and second-level gates 15 on zinc sulfide insulation layer 13. Input gate 16 and output 17 are also shown, together with signal processing circuitry 18.

In FIG. 2, the process for fabrication of the CCD imager is seen to begin with n-type mercury cadmium telluride substrate 21, and the growth of native oxide layer 22 thereon. The oxide growth is carried out by anodization in accordance with the method of U.S. Pat. No. 3,977,018 issued Aug. 24, 1976 to P. O. Catagnus and C. T. Baker. By selective etching, appropriate windows are formed in oxide layer 22 using a KTFR photoresist pattern and chemical etch. A suitable etchant is 10% lactic acid in deionized water, although it will be apparent to those skilled in the art that other etchants are also useful for this purpose. While the oxide removal mask remains in place, a diode 23a if formed preferably by ion implantation through an aperture in photoresist and then patterned by removing the mask to form the structure shown in FIG. 2. A p-type region may also be formed in n-type HgCdTe by selective out-diffusion of Hg, for example, by heating the masked slice in a vacuum of $10^{-6}$ ton for three hours at 125° C.

In FIG. 3, zinc sulfide layer 24 is deposited to cover the diodes and oxide layer 22. The zinc sulfide is deposited, for example, by thermal evaporation at 800° C. to form a layer of thickness of 2,000–3,000 angstroms, preferably about 2600 angstroms thick. Channel stop conductor 25 is then deposited and patterned on zinc sulfide layer 24 for the purpose of defining the lateral limits of the charge transfer signal channel. A layer of evaporated aluminum is suitable, for example, deposited to a thickness between 1,000 and 2,000 angstroms, and preferably about 1,500 angstroms. Next, a second layer 26 of zinc sulfide insulation is deposited and patterned to overlap the channel stop metal pattern.

As shown in FIG. 4, a first plurality of metal gates 27 is then deposited and patterned on the second zinc sulfide layer. Concurrently therewith, guard rings 28 are deposited and patterned to surround the input and output diode locations, thereby increasing the breakdown voltage.

As shown in FIG. 5, a third layer of zinc sulfide 31 is then deposited to cover the first level gates, followed by the step of depositing and patterning a second plurality of metal gates 32 on the third zinc sulfide layer, overlapping the intervals between the first level metal gates. Contact vias are then etched through the zinc sulfide, as shown in FIG. 6, to the separate metal layers and to the substrate, followed by the deposition and patterning of bonding pads, preferably nickelindium.

In FIG. 7, the longitudinal cross-section is seen to reveal substrate 21 having native oxide layer 22 thereon covered by first and third zinc sulfide layers 24 and 31, respectively having first-level metal gates 27 sandwiched therebetween to define the signal channel, and one of the first-level gates 27.

In FIG. 8, the transverse cross-section is seen to reveal the spacing between gates 27 and the channel stop field plate 25, which determines the shape of the potential profile in substrate 21. The sloping or contoured edges of $Z_nS$ layer 26 under gates 27, an optional feature, also contributes to the shaping of the potential profile.

A device fabricated in accordance with the invention was tested and found to display a charge transfer efficiency of 0.9990–0.9995 up to a frequency of 200 KHz, at temperatures in the range of 77° K. to 140° K. The well capacity was found to be $6 \times 10^{-8}$ coulombs per cm$^2$ for a gate voltage of 2.5 V and $1.25 \times 10^{-7}$ coul/cm$^2$ for a gate voltage of 5.0 V. The dark current at 50 KHz was 10 $\mu$A/cm$^2$ (at 0.25 e v) and 100 $\mu$A/cm$^2$ (at 0.125 e v).

We claim:

1. A process for fabricating an infrared imager comprising the steps of:
   (a) oxidizing the surface of a monocrystalline ternary alloy semiconductor body to form an oxide layer 500–1000 angstroms thick;
   (b) selectively removing predetermined portions of said oxide layer to form apertures therein;
   (c) forming suitable doped regions in said apertures to form junction diodes with the ternary alloy semiconductor surface;
   (d) depositing a layer of zinc sulfide to cover the oxide-conductor composite layer;
   (e) depositing and patterning a channel-stop conductor on said zinc sulfide to define a channel;
   (f) depositing and patterning a second zinc sulfide layer to overlap said channel-stop conductor;
   (g) depositing and patterning a first plurality of metal gates on said second zinc sulfide layer;
   (h) depositing a third layer of zinc sulfide to cover said gate;
   (i) depositing and patterning a second plurality of metal gates on said third zinc sulfide layer;
   (j) selectively removing portions of each zinc sulfide layer to form contact vias exposing selected gate and substrate locations; and
   (k) then forming conductive contacts to said exposed locations.

2. A method as in claim 1 wherein said ternary alloy semiconductor is oxidized by anodization.

3. A method as in claim 1 wherein said patterning steps are done by inverse photoresist processing.

4. A method as in claim 1 wherein said junction diodes are formed by selectively out-diffusing the more volatile element from the ternary alloy semiconductor surface.

5. A method as in claim 1 wherein said conductors and gates are aluminum.

* * * * *

UNITED STATES PATENT OFFICE
CERTIFICATE OF CORRECTION

Patent No. 4,377,904　　　　　　　　　Dated March 29, 1983

Inventor(s) Richard A. Chapman et al

It is certified that error appears in the above-identified patent and that said Letters Patent are hereby corrected as shown below:

IN THE TITLE

Delete "CCD" from the title.

Signed and Sealed this

Fifteenth Day of October 1985

[SEAL]

Attest:

Attesting Officer

DONALD J. QUIGG

Commissioner of Patents and Trademarks—Designate